(12) United States Patent
Cox et al.

(10) Patent No.: US 9,089,076 B2
(45) Date of Patent: Jul. 21, 2015

(54) COOLING SYSTEM FOR ELECTRONICS

(75) Inventors: Aaron R. Cox, Tucson, AZ (US);
William J. Grady, IV, Cary, NC (US);
Vinod Kamath, Raleigh, NC (US);
Jason A. Matteson, Raleigh, NC (US);
Jason E. Minyard, Phoenix, AZ (US)

(73) Assignee: International Business Machines Corporation, Armonk, NY (US)

(*) Notice: Subject to any disclaimer, the term of this patent is extended or adjusted under 35 U.S.C. 154(b) by 461 days.

(21) Appl. No.: 13/543,089

(22) Filed: Jul. 6, 2012

(65) Prior Publication Data

US 2014/0009882 A1    Jan. 9, 2014

(51) Int. Cl.
| | |
|---|---|
| *H05K 7/20* | (2006.01) |
| *G06F 1/20* | (2006.01) |
| *F28D 15/04* | (2006.01) |

(52) U.S. Cl.
CPC ............ *H05K 7/20454* (2013.01); *F28D 15/04* (2013.01); *G06F 1/20* (2013.01); *H05K 7/20336* (2013.01); *H05K 7/20218* (2013.01); *Y10T 29/49826* (2015.01)

(58) Field of Classification Search
CPC .......... H05K 7/20218; H05K 7/20336; F28D 15/0275; F28D 2021/0028; H01L 1/20; H01L 2200/211
See application file for complete search history.

(56) References Cited

U.S. PATENT DOCUMENTS

| | | | |
|---|---|---|---|
| 5,324,318 A | 6/1994 | Smith | |
| 5,679,457 A | 10/1997 | Bergerson | |
| 6,744,269 B1 | 6/2004 | Johnson et al. | |
| 6,862,185 B2 | 3/2005 | Morris | |
| 6,882,536 B2 | 4/2005 | Deeney et al. | |
| 6,898,084 B2 | 5/2005 | Misra | |
| 7,023,701 B2 | 4/2006 | Stocken et al. | |
| 7,522,421 B2 | 4/2009 | Roper et al. | |
| 7,715,197 B2 | 5/2010 | Tian et al. | |
| 7,826,217 B2 | 11/2010 | Kondo et al. | |
| 7,855,888 B2 * | 12/2010 | Peterson | 361/699 |
| 7,933,125 B2 | 4/2011 | Wei et al. | |
| 7,957,132 B2 | 6/2011 | Fried | |
| 7,969,736 B1 * | 6/2011 | Iyengar et al. | 361/699 |
| 7,978,472 B2 | 7/2011 | Campbell et al. | |
| 8,027,162 B2 | 9/2011 | Campbell et al. | |
| 8,315,055 B2 | 11/2012 | Joshi et al. | |

(Continued)

FOREIGN PATENT DOCUMENTS

WO    2011109501 A1    9/2011

OTHER PUBLICATIONS

Kamath et al., "Liquid Cooled Planer", U.S. Appl. No. 13/323,330, filed Dec. 12, 2011.

(Continued)

*Primary Examiner* — Gregory Thompson
(74) *Attorney, Agent, or Firm* — Nicholas D. Bowman; Bryan W. Butler

(57) ABSTRACT

An apparatus and method is provided for conveying heat away from an electronic component. In one embodiment, a method positions a conformable thermal interface element in heat conducting contact with an electronic component. A heat conducting member is disposed within the conformable thermal interface element. The heat conducting member is coupled with a manifold so that the heat conducting member is in heat conducting contact with the manifold. The electronic component may be installed or removed without disassembly of the apparatus.

23 Claims, 8 Drawing Sheets

(56) References Cited

U.S. PATENT DOCUMENTS

| | | |
|---|---|---|
| 8,488,325 B1 | 7/2013 | Yu |
| 8,570,744 B2 | 10/2013 | Rau et al. |
| 8,587,943 B2 * | 11/2013 | Barina et al. ............ 361/699 |
| 8,638,559 B2 * | 1/2014 | Barina et al. ............ 361/704 |
| 2003/0015314 A1 | 1/2003 | Akselband |
| 2003/0151892 A1 | 8/2003 | Kondo et al. |
| 2004/0250989 A1 | 12/2004 | Im et al. |
| 2005/0168939 A1 | 8/2005 | Iijima et al. |
| 2006/0250772 A1 | 11/2006 | Salmonson et al. |
| 2007/0074850 A1 | 4/2007 | Peschl |
| 2007/0201208 A1 | 8/2007 | Goodwin et al. |
| 2007/0212919 A1 | 9/2007 | Clayton et al. |
| 2009/0000773 A1 | 1/2009 | Levy |
| 2009/0002951 A1 | 1/2009 | Legen et al. |
| 2009/0213541 A1 | 8/2009 | Butterbaugh et al. |
| 2009/0277616 A1 * | 11/2009 | Cipolla et al. ........ 165/104.33 |
| 2009/0309214 A1 | 12/2009 | Szewerenko et al. |
| 2010/0025101 A1 * | 2/2010 | Steffler ..................... 174/527 |
| 2010/0085712 A1 | 4/2010 | Hrehor, Jr. et al. |
| 2010/0091447 A1 | 4/2010 | Jaggers et al. |
| 2010/0243203 A1 | 9/2010 | Liu et al. |
| 2010/0252234 A1 * | 10/2010 | Cambell et al. ............ 165/80.2 |
| 2011/0170264 A1 | 7/2011 | Lee et al. |
| 2011/0310565 A1 | 12/2011 | He |
| 2012/0020022 A1 | 1/2012 | Peterson et al. |
| 2012/0113586 A1 | 5/2012 | Rau et al. |

OTHER PUBLICATIONS

Meijer et al., "Liquid-Cooled Memory System Having One Cooling Pipe Per Pair of DIMMs", U.S. Appl. No. 13/360,328, filed Jan. 27, 2012.

Cox et al., "Cooling System for Electronics," U.S. Appl. No. 13/677,671, filed Nov. 15, 2012.

Cox et al., "Cooling System for Electronics," U.S. Appl. No. 14/547,831, filed Nov. 19, 2012.

Crippen et al., "BladeCenter Packaging, Power and Cooling", IBM Journal of Research and Development, Nov. 2005, vol. 49, No. 6, pp. 887-903, © 2005 IBM. (Received Dec. 16, 2004, Accepted Apr. 14, 2005, Published Online Oct. 7, 2005).

Iyengar et al., "Server Liquid Cooling with Chiller-less Data Center Design to Enable Significant Energy Savings", 28th Annual IEEE Semiconductor Thermal Measurement and Management Symposium (Semi-Therm), 2012, pp. 212-223, © 2012 IEEE. DOI: 10.1109/STHERM.2012.6188851.

Barina et al., "User-Serviceable Liquid DIMM Cooling System", U.S. Appl. No. 13/293,174, filed Nov. 10, 2011.

Barina et al., "Liquid-Cooling Memory Modules with Liquid Flow Pipes Between Memory Module Sockets", U.S. Appl. No. 13/305,092, filed Nov. 28, 2011.

* cited by examiner

COOLING SYSTEM FOR ELECTRONICS

TECHNICAL FIELD

Embodiments described herein generally relate to cooling systems, and more specifically, to cooling systems for electronic components.

BACKGROUND

The heat generated by electronic devices is proportional to the frequency at which they are operated. High operating frequencies result in high heat generation. In addition, the heat generated by electronic devices may be concentrated in locations where electrical components are placed in close proximity to one another. As one example, densely packed electrical components may concentrate the heat that the electronic devices generate. Modern electronic devices may include numerous closely-spaced components operated at high frequencies. Accordingly, modern electronic devices may generate a substantial amount of localized heat during operation.

SUMMARY

In one embodiment, an apparatus is provided for conveying heat away from an electronic component. The apparatus includes a conformable thermal interface element that is positioned to be in heat conducting contact with the electronic component. The apparatus further includes a heat conducting member disposed within the conformable thermal interface element. The apparatus also includes a manifold that is coupled to, and in heat conducting contact with, the heat conducting member.

In another embodiment, a method is provided for conveying heat away from an electronic component. The method includes positioning a conformable thermal interface element so that it is in heat conducting contact with an electronic component. A heat conducting member is disposed within the conformable thermal interface element. The heat conducting member is coupled with a manifold so that the heat conducting member is in heat conducting contact with the manifold.

BRIEF DESCRIPTION OF THE DRAWINGS

Embodiments are illustrated by way of example, and not by way of limitation, in the figures of the accompanying drawings in which like reference numerals refer to similar elements or steps.

DETAILED DESCRIPTION

Figure 1:
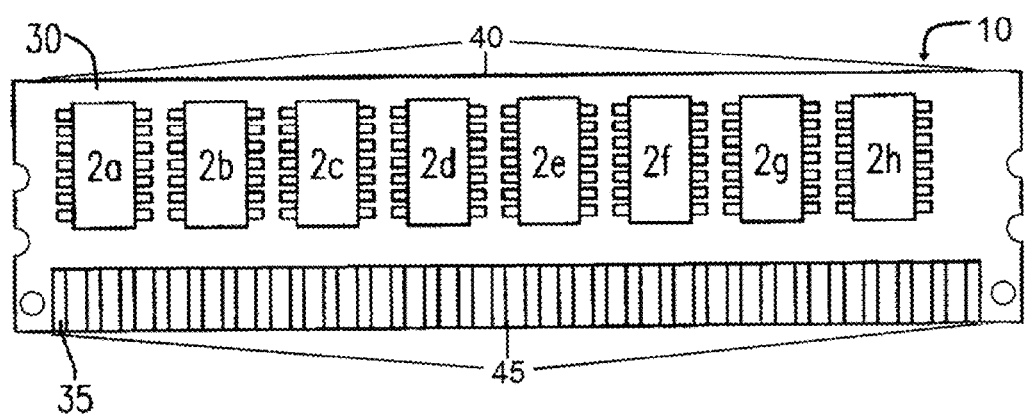
FIG. 1 shows a schematic representation of an electronic component according to one embodiment.

Often heat must be removed from an electronic device and its immediate area in order for the device to maintain an operational temperature within desired limits. Failure to remove heat effectively results in increased device temperatures, which in turn, may lead to thermal runaway conditions causing decreased performance and potentially catastrophic failure. Thermal management is the process of maintaining a desirable temperature in electronic devices and their surroundings. Several trends in the electronic industry have converged to increase the importance of thermal management. The desire for faster and more densely packed circuits has had a direct impact on the importance of thermal management. First, heat production increases as device operating frequencies increase. Second, as more and more devices are packed into a single chip, heat flux (Watts/cm$^2$) increases, resulting in the need to more aggressively remove heat from a given size chip or module. These device density and higher operating frequency trends have combined to create applications where it is no longer desirable to remove heat from modern devices solely by traditional air cooling methods, such as by using air cooled heat sinks with vapor chambers. Such air cooling techniques are inherently limited in their ability to extract heat from an electronic device with high power density. The need to cool current and future high heat load, high heat flux electronic devices and systems therefore mandates the development of aggressive thermal management techniques using alternate cooling methods. The methods prior to this invention limited access and serviceability of the cooled electronic components as they either connect to the cooled electronic component on envelope it in such a way that impedes access.

Features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments may be practiced and to further enable those of skill in the art to practice the invention. It is also to be understood that the descriptions of the embodiments are provided by way of example only, and are not intended to limit the scope of this invention as claimed.

FIG. 1 is one embodiment of an electronic component 10 having a multiplicity of electronic devices 2a through 2h (collectively hereafter referred to as 2) which are mounted on a circuit board 30. The circuit board 30 has a connector 35. In various embodiments, the circuit board 30 may be a printed circuit board (PCB), printed wiring board (PWB), etched wiring board, or other body for mounting and electrically connecting electronic devices. In various embodiments, the electronic device mounted to the circuit board 30 may include any of the following: microprocessors, capacitors, resistors, inductors, semi-conductor elements, integrated circuits, chip carriers, or any electric devices designed or modified for mounting on a circuit board 30.

Connector 35 may be used to interface the electronic component 10 with other electronics, allowing for the transfer of information, and may optionally provide a conduit for electric power to the electronic component 10. In one embodiment, the connector 35 may be a computer bus interface connector, one example of which is a Peripheral Component Interconnect Express (PCIe) style edge connector. In another embodiment, the connector 35 may be a computer memory edge connector, communication socket, or a board-to-board connector. In another embodiment, the connector 35 may be of an optical type. One embodiment of the electronic component 10 may be a memory module. In other embodiments, this electronic component 10 may be a graphics card, network card, expansion card, adaptor card, interface card, server component, server blades, or other electronic component. It is contemplated that additional forms of connector 35 or electronic component 10 may be employed and still remain within the scope and spirit of the presented invention.

In the illustrated embodiment, a proximal end 45 of the electronic component 10 is the end with the connector 35. A distal end 40 of the electronic component 10 is the side opposite proximal end 45. In various embodiments, the distal end 40 of the electronic component 10 is the end of the component that may have force applied to it for installing the electronic component 10 into an installed position.

Figure 2A:
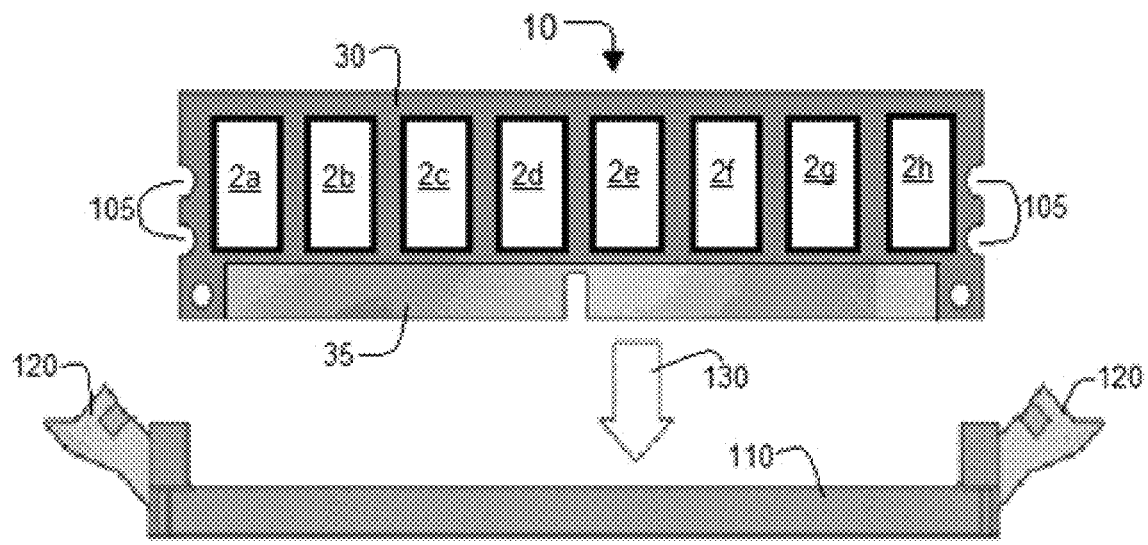
FIG. 2A shows a schematic representation of an electronic component positioned to be installed into a receptacle according to one embodiment.
Figure 2B:
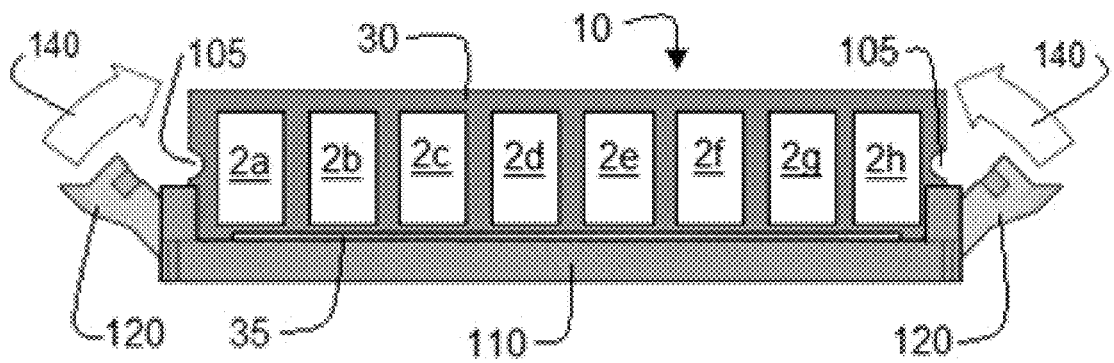
FIG. 2B shows a schematic representation of an electronic component installed in the receptacle of FIG. 2A in accordance with one embodiment.

In FIG. 2A, the electronic component 10 is oriented for installation in a receptacle 110 with an arrow 130 indicating the direction of insertion. FIG. 2B shows the same embodiment with the electronic component 10 having been inserted in receptacle 110 and the latches 120 are shown being moved into a locked position. Here, the latches 120 snap into notches 105 formed within the electronic component 10 to lock it into place with receptacle 110. Other embodiments of the receptacle 110 may employ alternative mechanisms to secure the electronic component 10 once installed or no locking mechanism may be used.

Figure 3A:
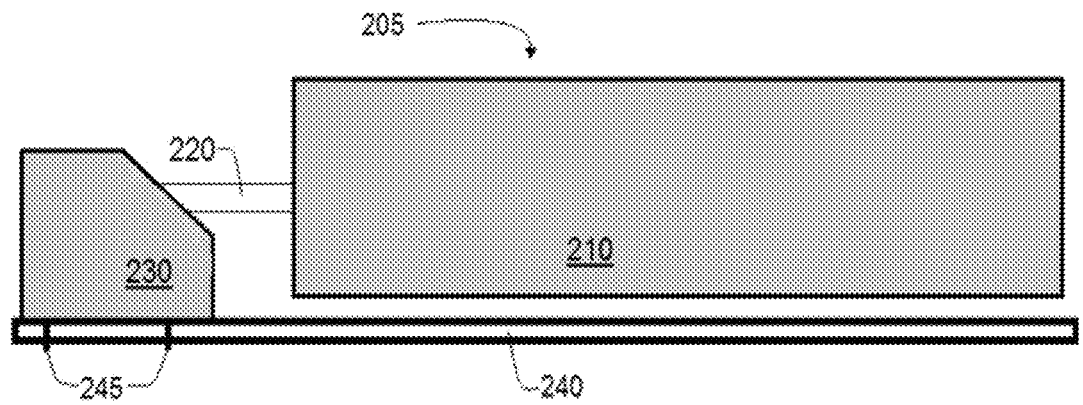
FIG. 3A is a side view of a cooling apparatus assembled according to one embodiment.
Figure 3B:
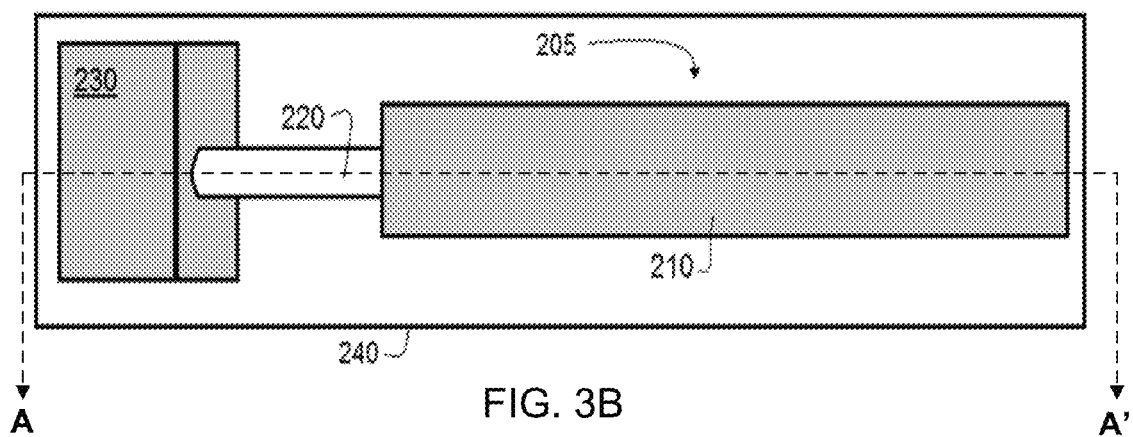
FIG. 3B is a top view of the cooling apparatus of FIG. 3A assembled according to one embodiment.
Figure 3C:
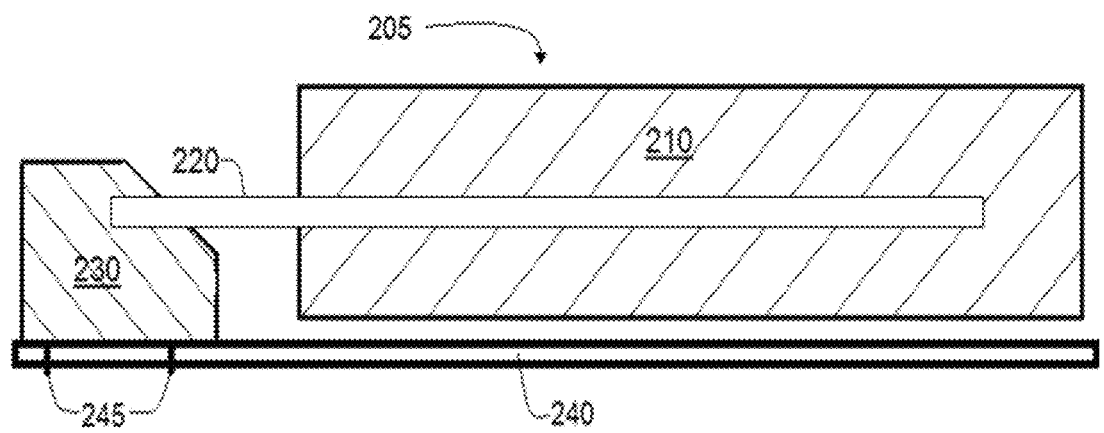
FIG. 3C is a horizontal cross sectional view along plane A-A' of the cooling apparatus of FIG. 3B according to one embodiment.

FIG. 3A is a side view schematic of one embodiment of a cooling apparatus 205 and is paired with FIG. 3B, a top view schematic of the same embodiment, and FIG. 3C, a horizontal cross sectional view along plane A-A', in accordance with the present invention. A conformable thermal interface element 210 may be positioned to conform to, and be in heat conducting contact with, the electronic component 10 of FIG. 1 once the electronic component is in an installed position. A heat conducting member 220 is shown disposed within, and in heat conducting contact with, the conformable thermal interface element 210. The heat conducting member 220 is also coupled to, and in heat conducting contact with, a cooling manifold 230.

In the illustrated example, the cooling manifold 230 is shown mounted to a planar panel 240 using pins 245. In various embodiments, the planar panel 240 may be a motherboard, the inside of a computer case, or part of a server housing. In other embodiments, the cooling manifold 230 may be mounted outside of and independent of any housing or containment of the electronic component it is designed to cool. The illustrated example shows use of the set of pins 245 on a single side of the cooling manifold 230 for mounting. In other embodiments, the cooling manifold may be mounted using screws, bolts, adhesives, or any mechanical means reasonable for securing it to a location and it may be mounted on one or more sides. These forms of mounting and installing are to be exemplary only and are not meant to limit the possible methods of mounting or installation of the cooling manifold 230.

The presented embodiment also shows how the cooling manifold 230 may mechanically support the heat conducting member 220 and the conformable thermal interface element 210. The heat conducting member 220 is shown as a single solid member with one end press fit into the cooling manifold 230 and the opposing end inserted into the conformable thermal interface element 210. In other embodiments, the heat conducting member 220 may be secured to the cooling manifold 230 for mechanical support by methods such as screwing, clamping, solder, welding, gluing, or any other suitable means. The cooling manifold 230 may keep the heat conducting member 220 and the conformable thermal interface element 210 in proper position against external forces such as gravity, installation and removal of electronic components 10, and vibration of equipment in proximity to or in contact with the cooling apparatus 205 or electronic device 10. Other embodiments may have the heat conducting member 220 coupled with, and in heat conducting contact with, cooling manifold 230, but mechanically supported by other means. An advantage of the structural support provided by the cooling manifold 230 is that an electronic component 10 may be installed or removed without disassembly of a cooling apparatus according to the principles of the present invention. For example, a technician servicing an electronic device need not first remove a cooling apparatus 205 that is connected to electronic component 10 in order to access electronic component 10. As further described below, a cooling apparatus according to present invention may include fluid within a heat conducting member or a cooling manifold. Further, the fluid may flow between a heat conducting member and a cooling manifold. In addition to requiring time consuming operations, disassembly of a cooling apparatus to allow installation or removal of an electronic component may result in fluid being spilled on an electronic component. Structural support provided by the cooling manifold 230 eliminates the need for disassembly when installing or removing an electronic component, which may advantageously prevent an undesired introduction of fluid into an electronic component environment. Moreover, known apparatus for cooling electronic components are typically complex devices. Known apparatus may wrap around or may be physically engaged with an electronic component by retaining clips or other fasteners. A further advantage of a cooling apparatus according to present invention may be improved usability of a computer system in comparison with systems using a known complex cooling apparatus.

In the illustrated embodiment, a single heat conducting member 220 and conformable thermal interface element 210 use a single cooling manifold 230. In other embodiments, two or more heat conducting members 220, each disposed within a conformable thermal interface element 210, may be used with a single cooling manifold 230. In other embodiments, more than one cooling manifold 230 may be coupled to a heat conducting member 220. This heat conducting contact enables heat created by the electronic component 10 to transfer through the heat conducting member 220 to the cooling manifold 230 for dispersing heat away from the electronic component 10. The thermal conductivity of the heat conducting member 220 may be equal to or greater than the thermal conductivity of the conformable thermal interface element 210.

In various embodiments, the cooling apparatus may use simple conduction to transfer heat away from the electronic component 10 to the cooling manifold 230. In other embodiments, the cooling apparatus 205 may also make use of convective heat transfer methods by using fluids flowing within various elements of the cooling apparatus 205 such as the heat conducting member 220 and the cooling manifold 230. In some embodiments, the heat conducting member 220 may be a heat pipe which uses a wick element and capillary pressure action to transfer heat between sections of the heat pipe. Other embodiments may use refrigeration effects such as boiling and condensation of fluids in various sections to transfer the heat.

The cooling manifold 230 may accept the heat transferred through the heat conducting member 220 and may dissipate this heat safely away from an electronic component 10 that generates the heat. The illustrated embodiment of the cooling manifold 230 is shown as a solid block. In other embodiments, the cooling manifold 230 may have multiple components and elements. In some embodiments, the cooling manifold 230 may use finning to improve heat dissipation. In another embodiment, the cooling manifold 230 may use a fluid disposed within it to dissipate the heat.

Figure 4A:
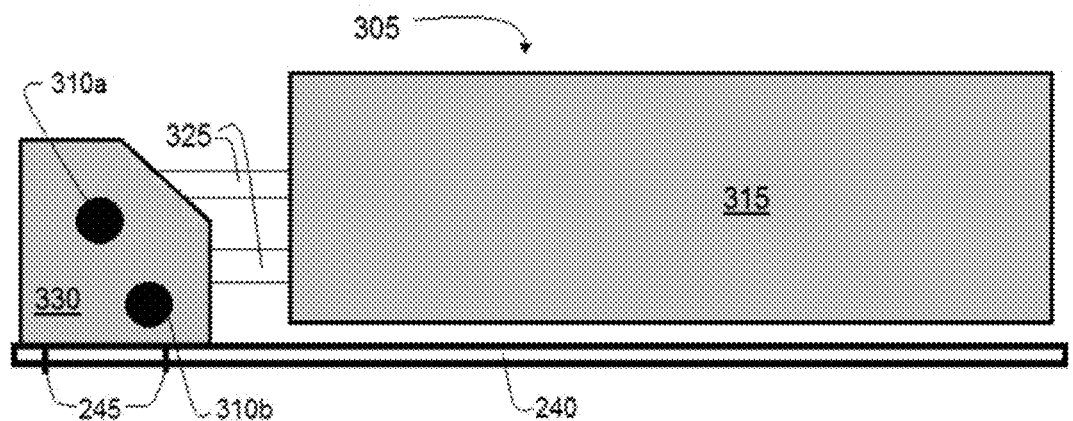
FIG. 4A is a side view of a cooling apparatus assembled according to one embodiment.
Figure 4B:
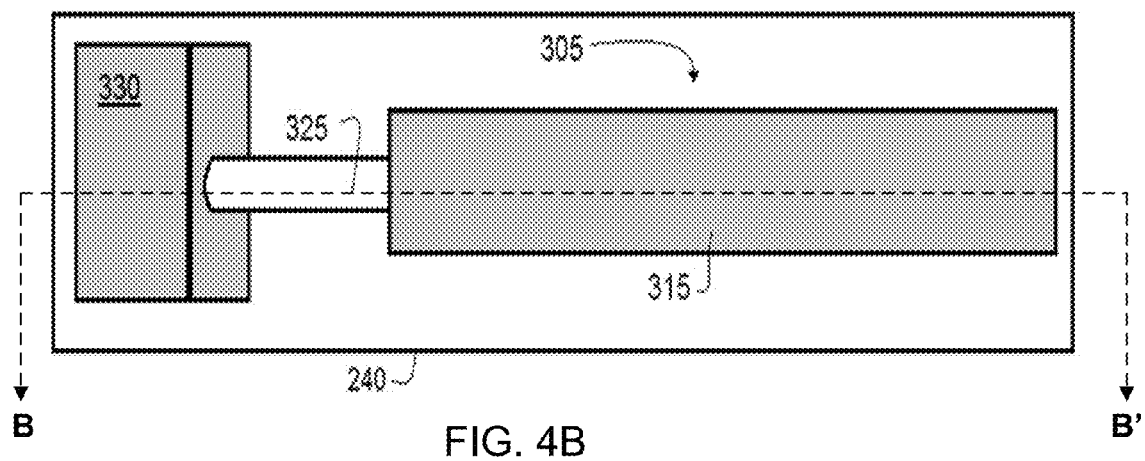
FIG. 4B is a top view of the cooling apparatus of FIG. 4A assembled according to one embodiment.
Figure 4C:
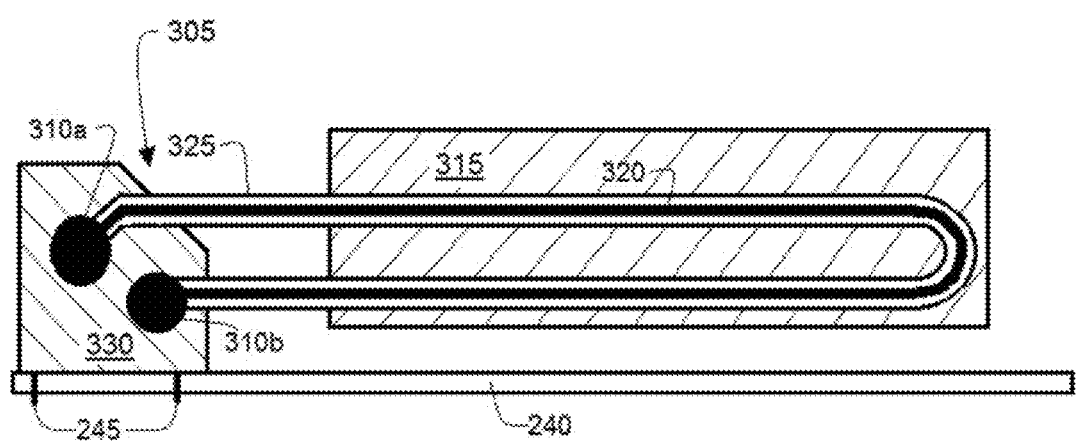
FIG. 4C is a horizontal cross sectional view along plane B-B' of the cooling apparatus of FIG. 4B according to one embodiment.

FIG. 4A is a side view schematic of one embodiment of a cooling apparatus 305 and is paired with FIG. 4B, a top view schematic of the same embodiment, and FIG. 4C a horizontal cross sectional view along plane B-B'. Heat conducting member 325, which is disposed within conformable thermal interface element 210, has a fluid channel 320 disposed within it and the cooling manifold 330. A fluid supply inlet 310a and a fluid supply outlet 310b may be built into in the cooling manifold 330 for providing a fluid for use in the fluid channel 320. In one embodiment, the fluid supplied may be part of a system that supplies and circulates fluid through one or more sets of cooling manifolds 230 and heat conducting members 325. In another embodiment, the fluid may be contained within only a single cooling manifold 330 and heat conducting member 325 while the fluid supply inlet 310a and fluid supply outlet 310b may be omitted. Such embodiments may either have a pumping mechanism built into the cooling manifold 330, or use a remote pumping system that pumps fluid to one or more cooling manifolds. Other embodiments may use a circulating effect similar to that used within a heat pipe, which uses wick elements and a capillary pressure action, or a refrigeration type effect which uses boiling and condensation of fluids in various sections to transfer the heat. In various embodiments, the fluid circulated may be water, de-ionized water, water treated to be anti-corrosive, or glycol-water solutions. The fluid may also be a dielectric fluid, refrigerant fluids, or other typical cooling fluid and remain within the scope and spirit of the invention.

Figure 5A:
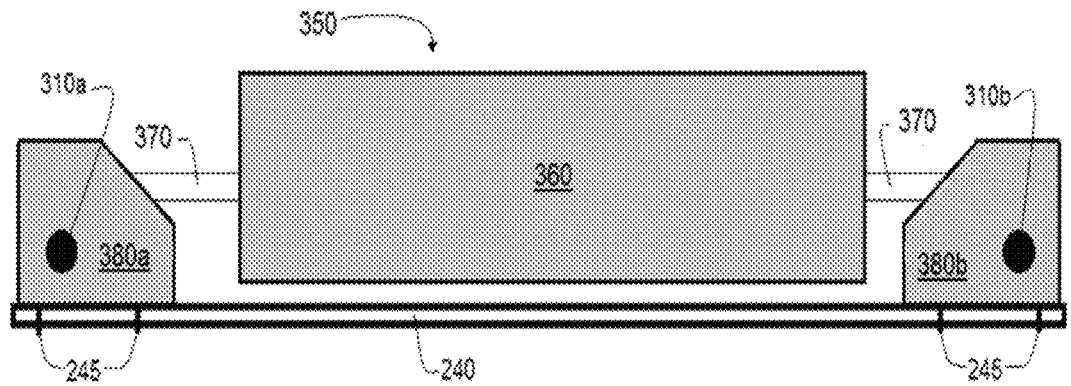
FIG. 5A is a side view of a cooling apparatus assembled according to one embodiment.
Figure 5B:
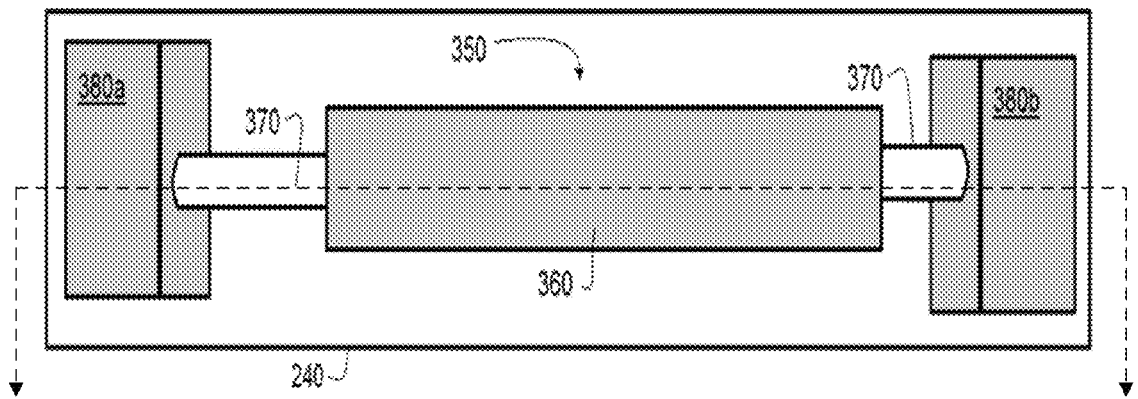
FIG. 5B is a top view of the cooling apparatus of FIG. 5A assembled according to one embodiment.
Figure 5C:
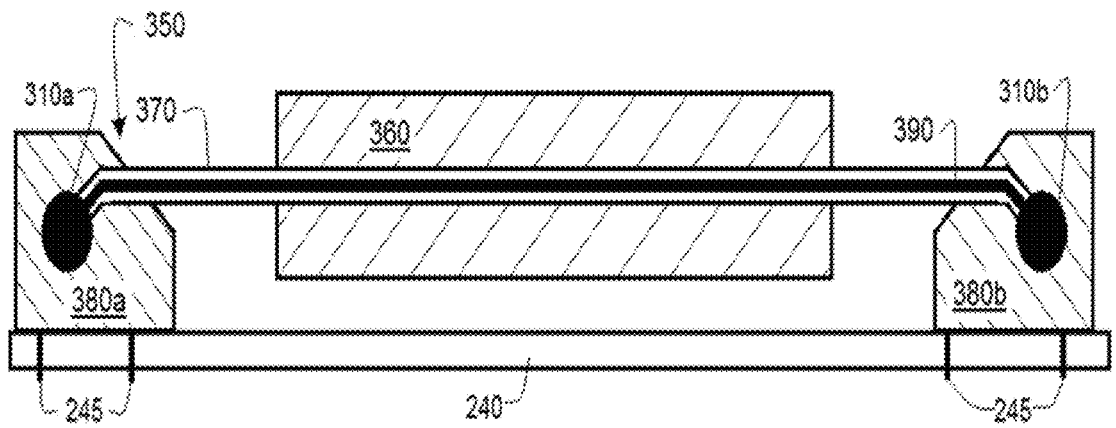
FIG. 5C is a horizontal cross sectional view along plane C-C' of the cooling apparatus of FIG. 5B according to one embodiment.

FIG. 5A is a side view schematic of one embodiment of a cooling apparatus 350 and is paired with FIG. 5B, a top view schematic of the same embodiment, and FIG. 5C a horizontal cross sectional view along plane B-B'. A fluid channel 390 is disposed within both the heat conducting member 370 and a pair of cooling manifolds 380a and 380b. A fluid supply inlet 310a is built into cooling manifold 230a for supplying a fluid to the fluid channel 390 disposed within the heat conducting member 370 and cooling manifolds 380a and 380b. The fluid may pick up heat as it passes through the area of the heat conducting member 370 that is in proximity to the electronic component 10 and disposed within the conformable thermal interface element 360. The fluid is then channeled out of cooling manifold 380b using a fluid disposal outlet 310b positioned within the cooling manifold 380b. A pumping mechanism may be built into the cooling manifold 380a or 380b, or a remote pumping system that pumps fluid to one or more cooling manifolds may be used. In another embodiment, two or more fluid channels within the heat conducting member 370 and cooling manifolds 380a and 380b may be used. In another embodiment, two or more heat conducting members 370 may be used to create a circulatory system between cooling manifolds 380a and 380b. In various embodiments, the fluid supply inlet 310a and fluid supply outlet 310b may be omitted. Embodiments that do not utilize externally supplied fluids through fluid supply inlet 310a and fluid supply outlet 310b may make use of a circulation systems mentioned above in relation to FIG. 4A-4C.

Figure 6:
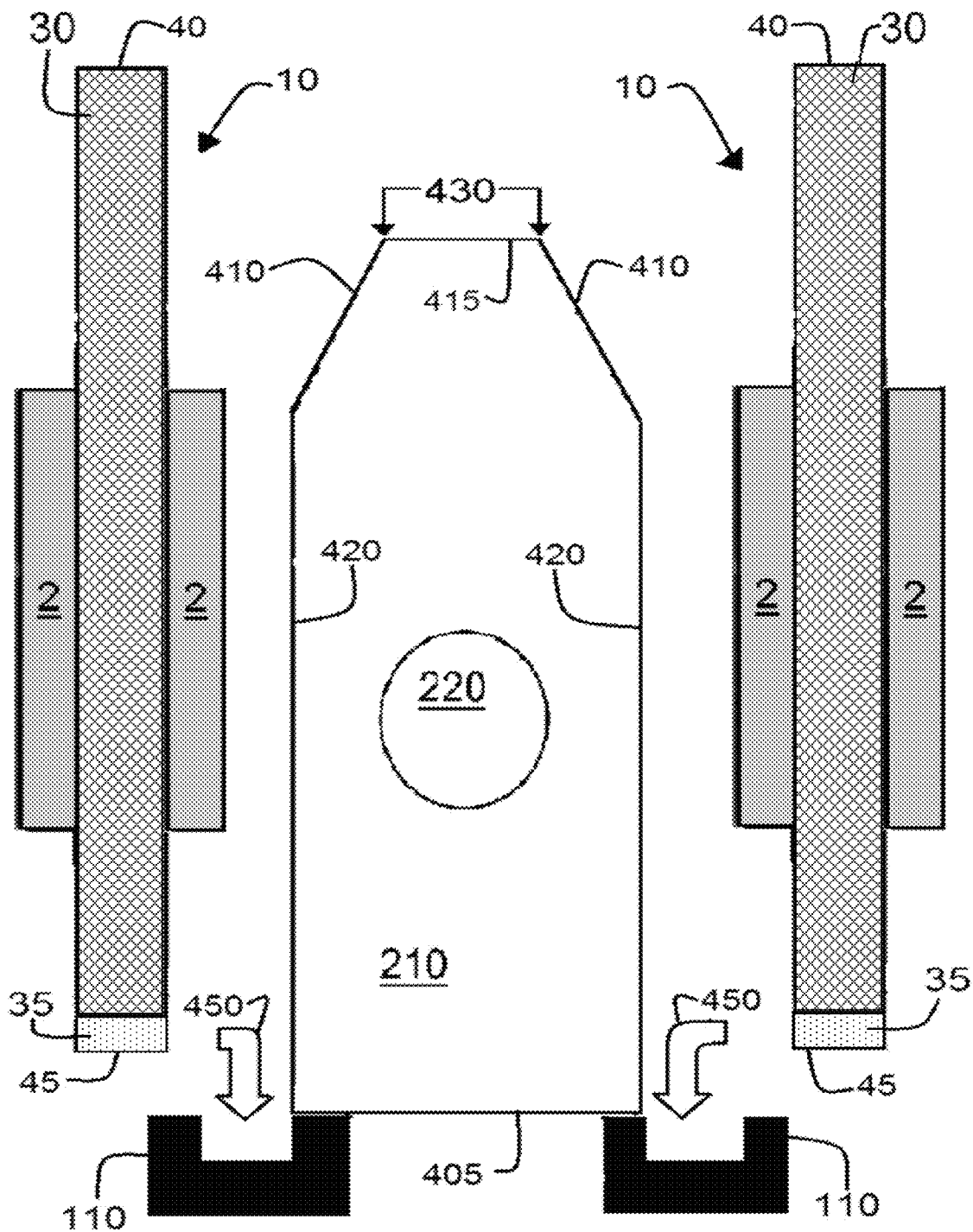
FIG. 6 is a cross sectional view of the conformable thermal interface element, a heat conducting member disposed within it, and a pair of electronic components prior to installation according to one embodiment.

FIG. 6 is a schematic view of a cross section of conformable thermal interface element 210 with a heat conducting member 220 disposed within it. In the illustrated embodiment, a cross section of a set of electronic components 10 is shown prior to installation into receptacles 110 with arrows 450 indicating the location and direction of installation of connectors 35 into receptacles 110. The conformable thermal interface element 210 may be positioned to be offset from the receptacles 110, such that it makes contact with installed electronic component 10, but does not interfere with insertion into the receptacle 110. The heat conducting member 220 may be located between two opposing sides of the conformable thermal interface element 210. A portion of a side of the conformable thermal interface element 210, referred to as a contact surface 420, contacts a side of an electronic component 10 in one or more locations where the electronic component 10 is in an installed position. One or both of the contact surfaces 420 of the conformable thermal interface element 210 may be sculpted so that it has a profile that conforms to a configuration of an electronic component 10 in an installed position. Various electronic components 10 may be configured with a variety of electronic devices 2 at a variety of different locations. In addition, the electronic devices may have a variety of shapes and sizes. When two electronic components 10 are installed, heat conducting member 220 may have heat transferred to it from both electronic components 10 through the conformable thermal interface element 210 during normal operation.

As illustrated in FIG. 6, the conformable thermal interface element 210 has a bottom side 405 and a top side 415. These sides may be defined by the orientation of the conformable thermal interface element 210 with respect to an electronic component 10. As previously mentioned, with reference to FIG. 1, the proximal end 45 and the distal end 40 of an electronic component 10 may be designated as being, respectively, on the end with the connector 35 and on the end opposite the connector 35. The bottom side 405 of the conformable thermal interface element 210 may be the side that is adjacent to the proximal end 45 of the electronic component 10. The top side 415 of the conformable thermal interface element 210 may be the side that is adjacent to the distal end 40 of the electronic component 10.

In one embodiment, the conformable thermal interface element 210 may have a beveled edge 410 connecting the top side 415 and a contact surface 420 that facilitates insertion of the electronic component 10 into the installed position. The contact surface 420 may be the part of the conformable thermal interface element 210 that makes contact with the electronic component 10 in the installed position. In the illustrated example, the beveled edge 410 results in a reduced cross section width 430 on the top side 415 that facilitates insertion of the electronic component 10 into a receptacle 110 into an installed position. The beveled edge 410 of conformable thermal interface element 210 may begin, for example, at about 80% of the distance up from the bottom side 405 to the top side 415. In other embodiments, the beveling may result in curved, rounded, notched, or squared shaping of the conformable thermal interface element 210 to facilitate installation of the electronic component 10.

Figure 7A:
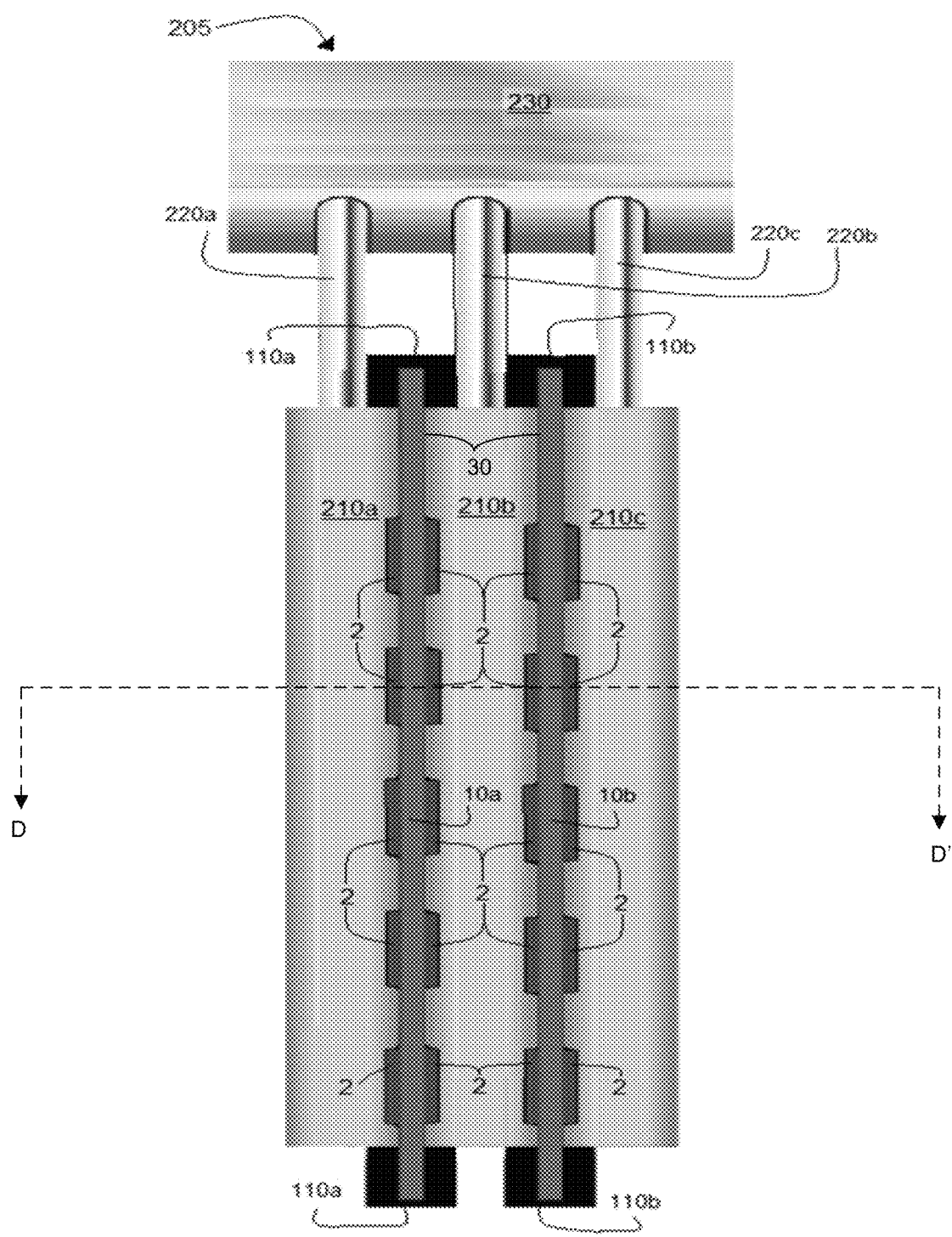
FIG. 7A is a top down view of a fully assembled cooling apparatus for two or more installed electronic components according to one embodiment.
Figure 7B:
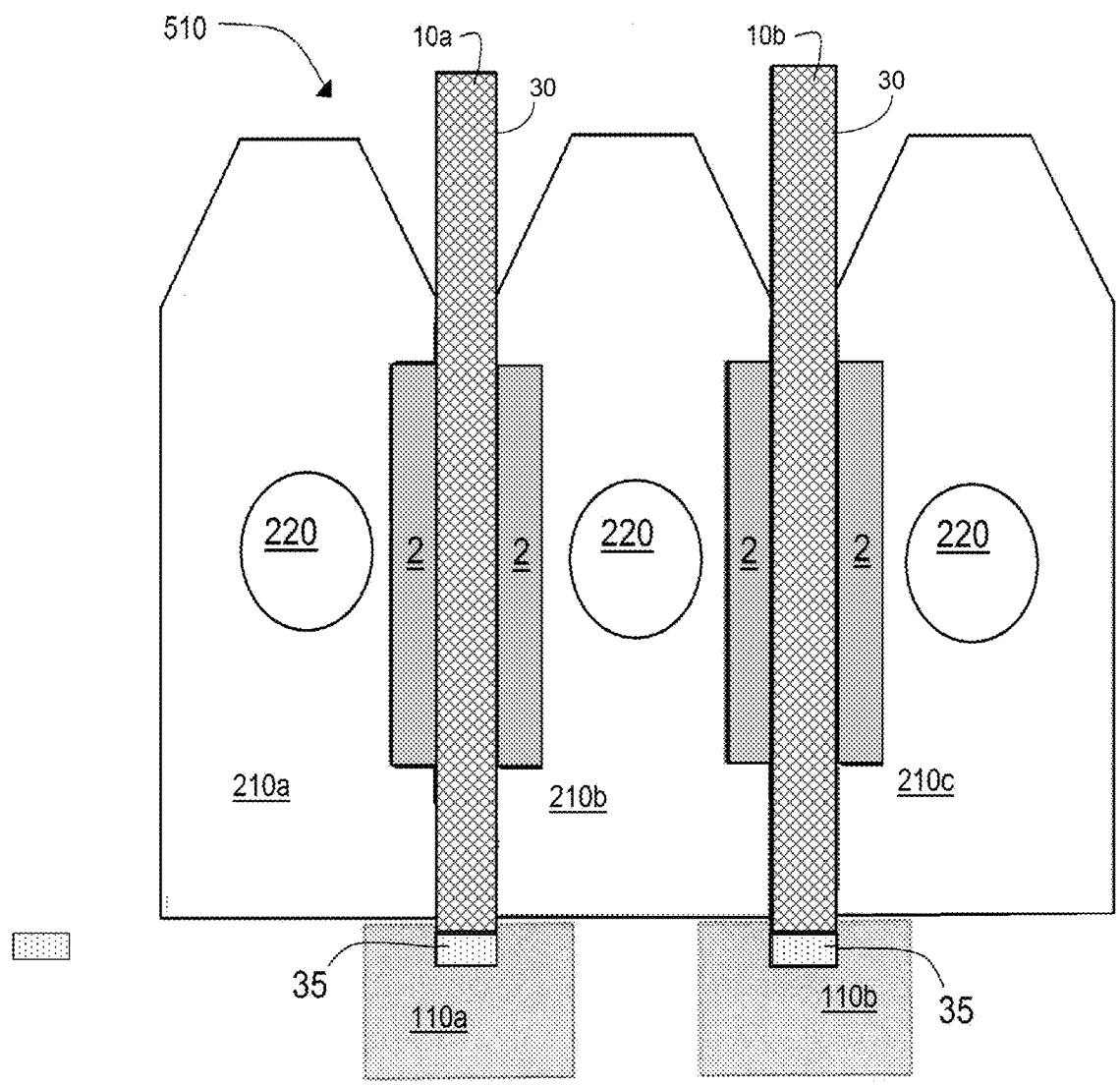
FIG. 7B is a cross sectional view of the cooling apparatus of FIG. 7A along plane D-D' for two or more installed electronic components according to one embodiment.

FIG. 7A is top down schematic view of one embodiment of the invention and is paired with FIG. 7B, a horizontal cross sectional view along plane D-D'. The shown embodiment includes electronic components 10*a* and 10*b*, a single cooling manifold 230, and three conformable thermal interface elements 210*a*, 210*b*, and 210*c* (collectively referred to hereafter as 210) having respective heat conducting members 220*a*, 220*b*, and 220*c* (collectively referred to hereafter as 220). The illustrated embodiment shows conformable thermal interface element 210*b* positioned to be in conformable contact with two opposing faces of the electronic components 10*a* and 10*b* that are fully installed in receptacles 110*a* and 110*b*. Conformable bodies 210*a* and 210*c* are positioned to be in conformal contact with the outside faces of electronic components 10*a* and 10*b*. In other embodiments, a single conformal thermal interface element 210 may be placed in contact with an electronic component 10, and it may be shaped to be in contact with only a single face of the electronic component 10 or with multiple faces of such a component.

The greater the thermally conductive surface area between the two bodies, the greater the amount of heat that may be conducted between them. Conformable thermal interface element 210 conforms to elements on the electronic component 10, specifically devices 2. This ability to conform around devices on the electronic component 10 provides a large surface area for heat conduction. The conformability of the conformable thermal interface element 210 also enables it to adapt to different sizes and shapes of electronic components 10 that may be installed in the receptacle 110. This allows for upgrading or replacement of electronic components 10 over time without a concern for modification or adjustment of the cooling apparatus 205. For example, when replacing a failed electronic device 10 the service technician need not first remove or disassemble the conformable thermal interface elements 210 or the heat conducting members 220 in order to access and replace electronic components 10.

In one embodiment, the electronic component 10 may have a board 30 that has a thickness approximately 1.4 mm (0.055 in.). The electronic component 10 may be thickest, approximately 4.4 mm (0.17 in), where the electronic devices 2 are mounted. In one embodiment, the boards 30 of the electronic components 10*a* and 10*b* shown in FIG. 7*a* and FIG. 7*b* are approximately 6 mm (0.236 in) apart. The conformable thermal interface elements 210 may be approximately 6.2 mm (0.244 in) thick, with the heat conducting members 220 having a diameter of approximately 2.5 mm (0.098 in). When the electronic components 10 are not installed, there may be approximately 1.2 mm (0.047 in) between each of the conformable thermal interface elements 210. The sculpting of the conformable thermal interface element 210 may assist in maximizing the thermally conductive surface area between it and the electronic component 10. Sculpting of the conformable thermal interface element 210 may result in changes of height, width, or an angle of a surface of the conformable thermal interface element 210 at specific locations for various configurations of electronic component 10.

In the presented embodiment, the conformable thermal interface element 210 may be formed from a thermally conductive polymeric composite material. One example material that may be used to form conformable thermal interface element 210 is a Gap Pad VO®, by the Berquist Company of Chanhassen, Minn. It has a thermal conductivity of 0.8 W/m-K and a Young's modulus, the measure of elasticity, of 100 kPa. This gives it both acceptable heat transfer capabilities and an ability to conform to the unevenness and changing topography of electronic component 10. It is contemplated that other materials may be used for the conformable thermal interface element 210 and still remains within the scope and spirit of the present invention. The thermal conductivity of any such material may be greater than 0.65 W/m-K, and a Young's modulus of less than 200 kPa.

As described above, a heat conducting member may include a fluid channel, e.g. the fluid channel 320. While the fluid channel may be tubular as shown in the figures, the fluid channel may be formed in other shapes in various alternative embodiments. For example, in one embodiment, the fluid channel may include a reservoir portion having an elongated dimension paralleling a contact surface of a conformable thermal interface element, thereby providing more surface area than a tubular structure.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. An apparatus for conveying heat away from an electronic component, comprising:
   a first conformable thermal interface element configured to be positioned in heat conducting contact with a first electronic component in an installed position, an integral surface of the first conformable thermal interface element conformable about a surface of the first electronic component;
   a first heat conducting member disposed within the first conformable thermal interface element; and
   a manifold coupled to and in heat conducting contact with the first heat conducting member.

2. The apparatus of claim 1, wherein the first electronic component is a circuit board having at least one memory module.

3. The apparatus of claim 1, wherein the first heat conducting member is a heat pipe.

4. The apparatus of claim 1, wherein the first heat conducting member includes a fluid channel.

5. The apparatus of claim 1, wherein the manifold supports the first heat conducting member.

6. The apparatus of claim 1, wherein the integral surface of the first conformable thermal interface element includes a contact surface having a profile sculpted to conform to a configuration of the first electronic component.

7. The apparatus of claim 1, wherein the first heat conducting member is located between first and second sides of the first conformable thermal interface element, the first side of the first conformable thermal interface element configured to be positioned in heat conducting contact with the first electronic component, the second side of the first conformable thermal interface element configured to be positioned in heat conducting contact with a second electronic component, wherein the first conformable thermal interface element is configured to transfer heat from the first and second electronic components to the first heat conducting member.

8. The apparatus of claim 1, wherein the first conformable thermal interface element includes a distal-end portion having a top side, a contact surface, and a beveled edge connecting the top side and contact surface, the beveled edge to facilitate insertion of the first electronic component into the installed position and removal therefrom.

9. The apparatus of claim 1, further comprising:
a second conformable thermal interface element configured to be positioned in heat conducting contact with a second electronic component in an installed position, an integral surface of the second conformable thermal interface element conformable about a surface of the second electronic component; and
a second heat conducting member disposed within the second conformable thermal interface element,
wherein the manifold is coupled to and in heat conducting contact with the second heat conducting member.

10. A method for conveying heat away from an electronic component, comprising:
transferring heat generated by a first electronic component in an installed position from the first electronic component to a first conformable thermal interface element in heat conducting contact with the first electronic component, an integral surface of the first conformable thermal interface element conformable about a surface of the first electronic component;
transferring the heat from the first conformable thermal interface element to a heat conducting member disposed within the first conformable thermal interface element; and
transferring the heat from the heat conducting member to a manifold in heat conducting contact with the heat conducting member.

11. The method of claim 10, wherein the first electronic component is a circuit board having at least one memory module.

12. The method of claim 10, wherein the first heat conducting member is a heat pipe.

13. The method of claim 10, wherein the first heat conducting member includes a fluid channel.

14. The method of claim 10, wherein the manifold supports the first heat conducting member.

15. The method of claim 10, wherein the integral surface of the first conformable thermal interface element includes a contact surface having a profile sculpted to conform to a configuration of the first electronic component.

16. The method of claim 10, wherein the first heat conducting member is located between first and second sides of the first conformable thermal interface element, the first side of the first conformable thermal interface element positioned in heat conducting contact with the first electronic component, the second side of the first conformable thermal interface element positioned in heat conducting contact with a second electronic component, wherein the first conformable thermal interface element transfers heat from the first and second electronic components to the first heat conducting member.

17. The method of claim 10, wherein the first conformable thermal interface element includes a distal-end portion having a top side, a contact surface, and a beveled edge connecting the top side and contact surface, the beveled edge to facilitate insertion of the first electronic component into the installed position and removal therefrom.

18. The method of claim 10, further comprising:
transferring additional heat generated by a second electronic component in an installed position from the second electronic component to a second conformable thermal interface element in heat conducting contact with the second electronic component, an integral surface of the second conformable thermal interface element conformable about a surface of the second electronic component;
transferring the additional heat from the second conformable thermal interface element to a second heat conducting member disposed within the second conformable thermal interface element; and
transferring the additional heat from the second heat conducting member to the manifold, wherein the second heat conducting member is in heat conducting contact with the manifold.

19. An apparatus for conveying heat away from a heat generating component, comprising:
a thermal interface element having a contact surface configured to contact a surface of the heat generating component in an installed position, the contact surface having an unconformed shape;
a heat conducting member disposed within the thermal interface element; and
a manifold to support the heat conducting member, wherein the contact surface is configured to elastically and releaseably conform to the shape of the surface of the heat generating component in the installed position when brought into contact therewith.

20. The apparatus of claim 19, wherein the heat conducting member is a heat pipe.

21. The apparatus of claim 19, wherein the heat conducting member includes a fluid channel.

22. The apparatus of claim 19, wherein the manifold includes a fluid channel.

23. The apparatus of claim 19, wherein the contact surface is further configured to return to the unconformed shape when removed from contact with the surface.

* * * * *